United States Patent
Luvara et al.

[11] Patent Number: 6,121,679
[45] Date of Patent: Sep. 19, 2000

[54] STRUCTURE FOR PRINTED CIRCUIT DESIGN

[76] Inventors: John J. Luvara, 2289 Bedford St., D14, Stamford, Conn. 06905; Jay J Quigley, 14 Celestial La., Wallingford, Conn. 06492; Ray Prasad, 2240 SW. Gardenview Ave., Portland, Oreg. 97225

[21] Appl. No.: 09/037,903

[22] Filed: Mar. 10, 1998

[51] Int. Cl.[7] .................................................. H01L 23/48
[52] U.S. Cl. ........................... 257/700; 257/701; 257/702
[58] Field of Search ................................ 257/700, 701, 257/702

[56] References Cited

U.S. PATENT DOCUMENTS

| | | | |
|---|---|---|---|
| 4,438,560 | 3/1984 | Kisters | 29/830 |
| 4,630,172 | 12/1986 | Stenerson et al. | 361/386 |
| 4,638,348 | 1/1987 | Brown et al. | |
| 4,839,717 | 6/1989 | Phy et al. | |
| 4,979,663 | 12/1990 | Sofia et al. | 228/180.2 |
| 5,046,953 | 9/1991 | Shreeve et al. | 439/66 |
| 5,173,767 | 12/1992 | Lange et al. | 257/700 |
| 5,177,863 | 1/1993 | Lam | 29/830 |
| 5,216,806 | 6/1993 | Lam | 29/848 |
| 5,222,014 | 6/1993 | Lin | 361/414 |
| 5,253,415 | 10/1993 | Dennis | 29/827 |
| 5,311,057 | 5/1994 | McShane | 257/781 |
| 5,378,859 | 1/1995 | Shirasaki et al. | 174/261 |
| 5,381,039 | 1/1995 | Morrison | 257/700 |
| 5,383,269 | 1/1995 | Rathmell et al. | 29/830 |
| 5,406,701 | 4/1995 | Pepe et al. | 29/840 |
| 5,412,247 | 5/1995 | Martin | 257/701 |
| 5,454,160 | 10/1995 | Nickel | 29/840 |
| 5,455,385 | 10/1995 | Newton et al. | 257/700 |
| 5,461,774 | 10/1995 | Holmes et al. | 29/840 |
| 5,473,814 | 12/1995 | White | 29/840 |
| 5,477,611 | 12/1995 | Sweis et al. | 29/840 |
| 5,477,933 | 12/1995 | Nguyen | 174/262 |
| 5,481,436 | 1/1996 | Werther | 361/784 |
| 5,490,040 | 2/1996 | Gaudenzi et al. | 361/773 |
| 5,490,324 | 2/1996 | Newman | 29/830 |
| 5,495,398 | 2/1996 | Takiar et al. | 361/790 |
| 5,541,367 | 7/1996 | Swamy | 174/260 |
| 5,576,519 | 11/1996 | Swamy | 174/265 |
| 5,615,477 | 4/1997 | Sweitzer | 29/840 |
| 5,616,520 | 4/1997 | Nishiuma et al. | 438/125 |
| 5,625,944 | 5/1997 | Werther | 29/843 |
| 5,641,946 | 6/1997 | Shim | 174/261 |
| 5,647,122 | 7/1997 | Launay et al. | 29/840 |
| 5,654,243 | 8/1997 | Yoneda et al. | 29/840 |
| 5,672,909 | 9/1997 | Glenn et al. | 257/668 |
| 5,706,178 | 1/1998 | Barrow | 361/777 |
| 5,714,800 | 2/1998 | Thompson | 257/700 |

*Primary Examiner*—Cathy F. Lam
*Attorney, Agent, or Firm*—Bachman & LaPointe, P.C.

[57] ABSTRACT

A substrate structure for surface mount devices includes: a plurality of substrate layers including at least a base layer and an outer layer; the base layer having a contact surface and a first array of conductive pads on the contact surface; the outer layer having a contact surface, a cutout and a second array of conductive pads on the contact surface; and the outer layer being mounted to the base layer with the cutout positioned over the first array, wherein the first array and the second array define in combination a device mounting site.

16 Claims, 3 Drawing Sheets ively large number of contacts or balls for contacting conductive pads of a substrate, and each pad must be routed for interconnection with various components and test point vias. As shown in FIG. 1, this routing adds to the layer count of the substrate, and further requires a potentially large number of vias underneath the package.

STRUCTURE FOR PRINTED CIRCUIT DESIGN

BACKGROUND OF THE INVENTION

The invention relates to a structure for printed circuit design and, more specifically to a substrate structure for surface mounted components or devices which eliminates or substantially reduces the need for vias directly beneath the surface mounting site.

Array surface mounted devices such as ball grid array packages (BGAs, PBGAs, CBGAs, TBGAS, etc.), chip scale packages (CSPs), and direct chip attach (flip chips) are being used to achieve better performance in system miniaturization. However, these types of devices have large numbers of contacts or balls for contacting conductive pads of a substrate, and each pad must be routed for interconnection with various components and test point vias. As shown in FIG. 1, this routing adds to the layer count of the substrate, and further requires a potentially large number of vias underneath the package.

This conventional routing and via configuration adds to manufacturing costs, and further provides for additional connections which are subject to potential failure such as during the manufacturing process.

The need remains for a cost-effective and reliable method for connecting array surface mounted devices to substrates.

It is therefore the primary object of the present invention to provide a substrate structure for mounting array surface mounted devices wherein vias directly beneath the device are reduced or eliminated.

It is a further object of the present invention to provide a substrate structure for surface mounting such devices which results in a reduction in the number of layers as compared to conventional dielectric substrate constructions.

It is still another object of the present invention to provide a substrate structure as described above which is less expensive and more reliable.

Other objects and advantages of the present invention will appear hereinbelow.

SUMMARY OF THE INVENTION

In accordance with the present invention, the foregoing objects and advantages have been readily attained.

In accordance with the invention, a substrate structure is provided which uses a plurality of dielectric layers having at least one dielectric layer positioned over a base layer or PCB to form a substrate structure wherein each layer has a cutout increasing in size away from the base layer. This defines a mounting site wherein a portion of pads are located on each layer, and a portion on the base layer, with corresponding traces provided on the respective layer. In this manner, a mounting site may be provided with routing for a large number of pads which eliminates or at least substantially reduces the need for vias underneath the package or device mounting site.

According to the invention, a substrate structure for surface mount devices is provided which substrate structure comprises: a plurality of substrate layers including at least a base layer and an outer layer; said base layer having a contact surface and a first array of conductive pads on said contact surface; said outer layer having a contact surface, a cutout and a second array of conductive pads on said contact surface; and said outer layer being mounted to said base layer with said cutout positioned over said first array, wherein said first array and said second array define in combination a device mounting site.

In accordance with an additional embodiment of the present invention, a substrate structure for surface mount devices is provided, which substrate structure comprises: a base layer having a contact surface and a first array of conductive pads on said contact surface; and at least one additional layer each having a contact surface, a cutout and a further array of conductive pads around said cutout on said contact surface, said at least one additional layer being positioned substantially adjacent to said base layer such that said first array and said further array of each additional layer define in combination a package mounting site.

In accordance with still another aspect of the present invention, a printed circuit structure is provided, which structure comprises: a surface mount device having a mounting surface and a plurality of conductive members disposed on said mounting surface; and a substrate structure for mounting said package, comprising a plurality of substrate layers including at least a base layer and an outer layer; said base layer having a contact surface and a first array of conductive pads on said contact surface; said outer layer having a contact surface, a cutout and a second array of conductive pads on said contact surface; and said outer layer being mounted to said base layer with said cutout positioned over said first array, said first array and said second array defining in combination a package mounting site; said surface mount device being connected to said mounting site with said conductive members connected to said first array and said second array.

The routing architecture and substrate structure of the present invention may suitably be used to provide mounting sites for packages or devices on either the primary or secondary side of the printed circuit structure or PCB, or on both sides, as desired.

BRIEF DESCRIPTION OF THE DRAWINGS

A detailed description of preferred embodiments of the present invention follows, with reference to the attached drawings, wherein.

DETAILED DESCRIPTION

In accordance with the present invention, a substrate structure is provided for mounting array surface mounted devices which reduces or eliminates the need for vias directly beneath the package or device and which further reduces the total layer count required in the substrate structure.

Figure 1:
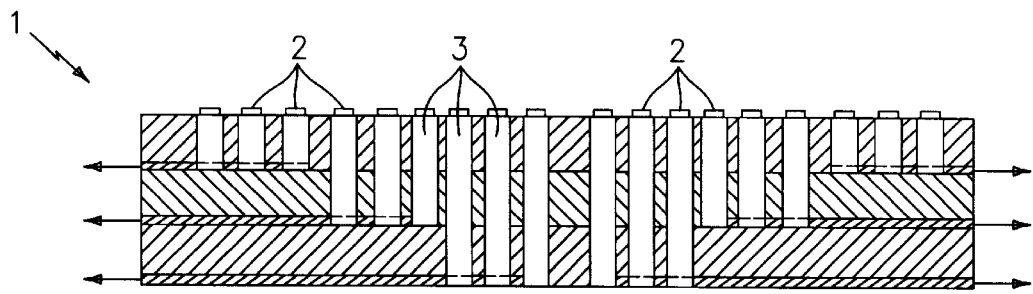
FIG. 1 is a side sectional view with exaggerated layer thickness of a prior art substrate structure.

FIG. 1 illustrates a prior art substrate structure 1 having a number of pads 2 which are adapted for contact with conductive solder balls of an array surface mounted package. As will be further described below, each pad 2 is preferred to be connected to other components as well as test point vias. These interconnections are typically made using traces which are etched or otherwise positioned along layers of the substrate structure. Pads 2 are typically positioned to correspond to solder balls of a BGA chip or other structure. These solder balls are typically positioned at a pitch or spacing of 6–60 mils depending upon the type of device. For example, BGA devices typically have a pitch of 40–60 mils, chip scale packages (CSP's) typically have a pitch of 10–40 mils, and flip chips may typically have a pitch of 6–12 mils. The traces for inner pads, as is readily apparent, must pass through gaps between pads of the outermost row of pads on each layer of the substrate structure. Allowing for sufficient space between each trace, and at a commonly used BGA pitch of 50 mils, a reasonable maximum of two traces can pass between each pair of pads. It should readily be apparent that traces for only a limited number of pads, for example the second and third innermost row of pads, can pass between each pad of the outermost row. Further, regardless of improvements providing for smaller pitch, a limitation will no doubt remain as to the number of traces which can be etched between two pads.

Figure 1A:
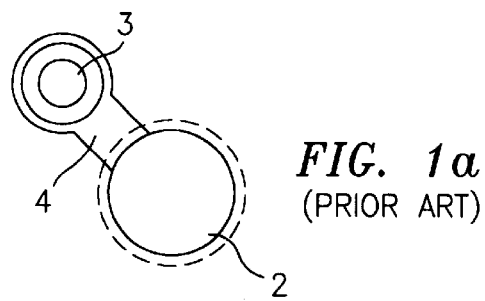
FIG. 1a further illustrates a top view of the prior art structure of FIG. 1.

As shown in FIG. 1, this problem is currently addressed by providing additional layers beneath the top layer, and vias 3 adjacent and connected to pads 2 which lead to different layers from inner pads 2 so that additional traces can be positioned along different layers. FIG. 1a shows how pads 2 are conventionally connected, through connectors 4, to vias 3. This structure is not illustrated in FIG. 1 for the sake of simplicity. As set forth above, although this addresses the specific problem of interconnection of each pad 2, the additional vias 3 add an additional element which may be subject to failure, thereby lessening reliability, and the layer count and cost of the substrate is also increased. Further, buried vias and other fabrication difficulties are also common and may lead to reduced reliability.

Figure 2:
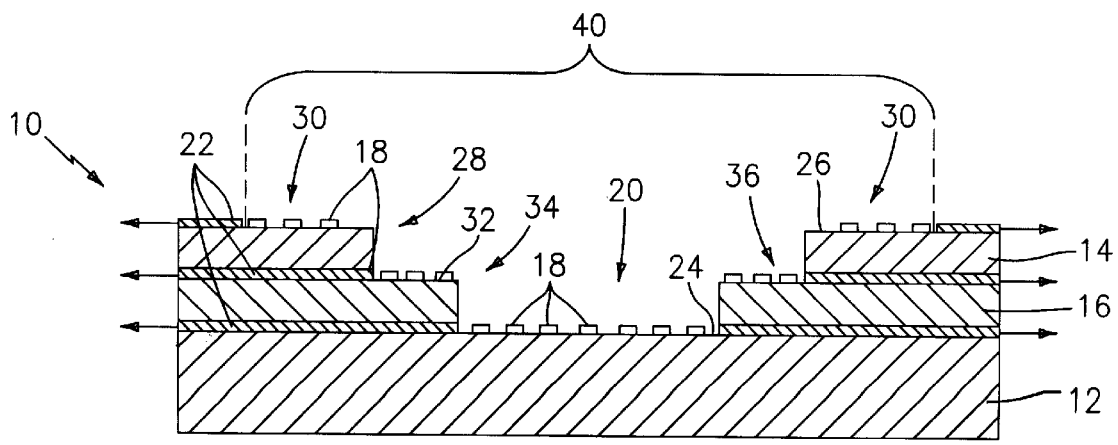
FIG. 2 is a side sectional view of a substrate structure in accordance with the present invention having exaggerated layer thickness.
Figure 6A:
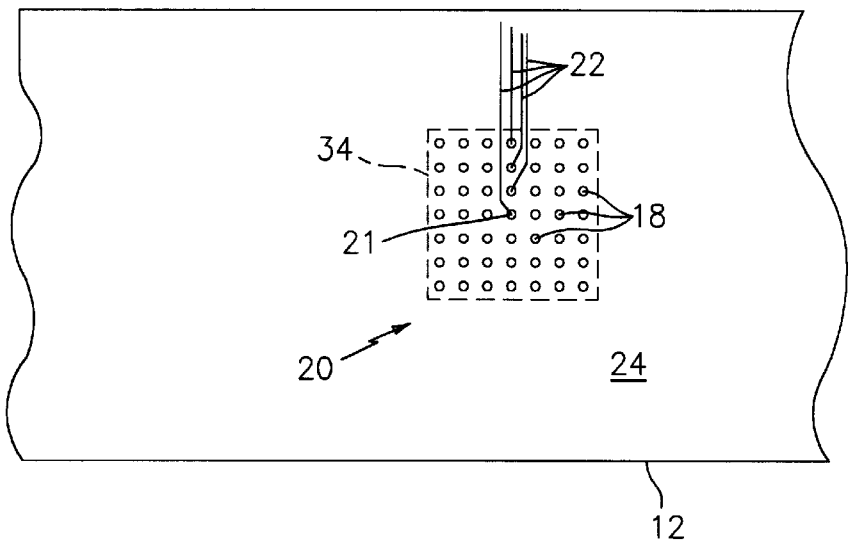
FIGS. 6a–6c are top views of layers of a substrate structure in accordance with the present invention.
Figure 6B:
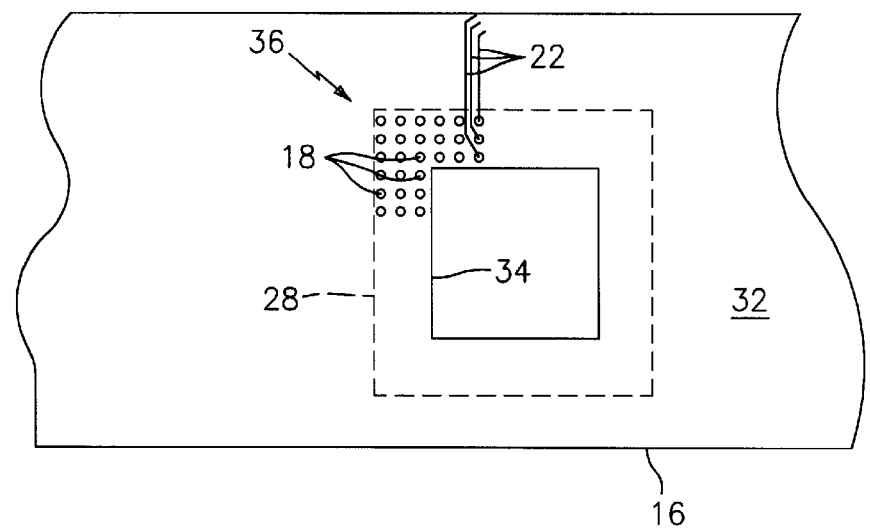
Figure 6C:
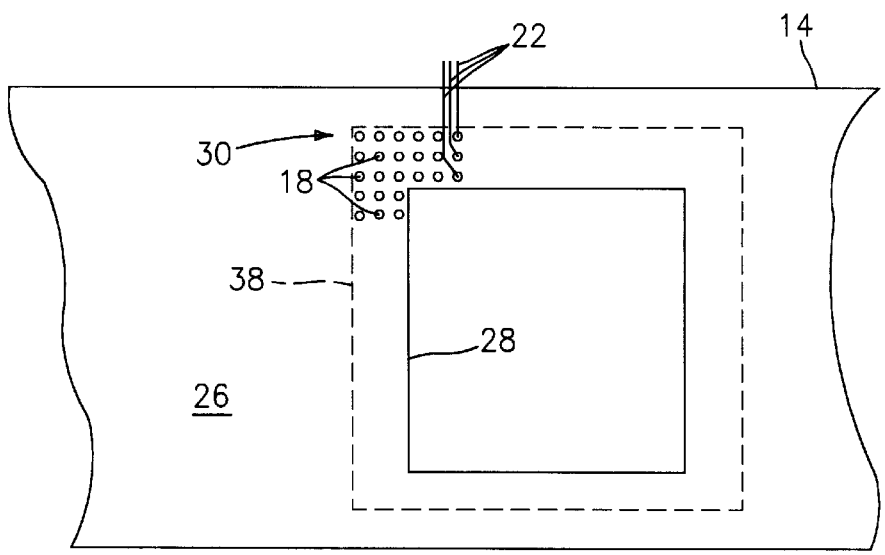

Referring to FIG. 2, a substrate structure is illustrated in accordance with the present invention and overcoming the problems in connection with the prior art substrate structure of FIGS. 1 and 1a. As shown in FIG. 2, a substrate structure 10 in accordance with the present invention is preferably provided having at least a base or bottom layer or core 12 and a top or outer layer 14, and preferably at least one intermediate layer 16. Layers 12, 14 and 16 are shown in FIG. 2 having an exaggerated thickness which will assist in understanding of the present invention. However, as discussed below, layers 14, 16 are preferably very thin layers of dielectric material such that the difference in height of pads on different layers does not interfere with good connection with a device. As shown, layers 14, 16 are provided having cutouts (see also FIGS. 6a, 6b and 6c), and each layer has an array of pads 18. Referring also to FIGS. 6a–6c, the preferred array or configuration of pads 18 for each layer in accordance with the present invention is further illustrated.

FIG. 6a shows a typical bottom or base layer 12 having a first or centrally located array 20 of pads 18. As shown, this first array 20 includes a center pad 21 and a pattern of pads 18 surrounding center pad 21 which is approximately 3 pads in width. Also as shown, traces 22 are provided leading from each pad 18 along the upper or contact surface 24 (see FIG. 2) of bottom layer 12, preferably to a test point via (not shown).

FIG. 6b is a top view of an intermediate layer 16 having an upper or contact surface 32 (see FIG. 2), a cutout 34 and an array 36 of pads 18 disposed around cutout 28. Referring back to FIG. 6a, cutout 34 is shown in dashed lines with respect to bottom layer 12 to further illustrate the positioning of intermediate layer 16 relative to bottom layer 12 such that cutout 34 is positioned over and exposing first array 20 as desired. Still referring to FIG. 6b, traces 22 are also provided leading away from each pad 18 of array 36 along upper surface 32 of intermediate layer 16, also preferably to test point vias as is known in the art. As shown, array 36 is preferably a band of pads 18 disposed around a periphery of cutout 34 and being generally three pads wide or deep. Of course, pads 18 could be provided in patterns of different width if desired, and could also be provided around only a portion of cutout 34, for example along only one or several edges, if desired.

FIG. 6c shows a top view of outer layer 14 having an upper or contact surface 26 (see FIG. 2), a cutout 28 and an array 30 of pads 18 disposed around cutout 28. Traces 22 are shown connected to each pad 18 of array 30, and also leading away to connection with test point vias (not shown) as desired. Referring to FIG. 6b cutout 28 is illustrated in dashed lines around array 36 of intermediate layer 16 so as to further illustrate the positioning of top layer 14 relative to intermediate layer 16. In addition, FIG. 6c shows in dashed lines an additional cutout 38 which would be formed in a further layer (not shown) positioned above outer layer 14, if desired.

From a consideration of FIGS. 2 and 6a–6c, it should readily be appreciated that layers 12, 14, 16 including cutouts and arrays of pads as discussed above serve, in combination, to define a mounting site 40 (FIG. 2) for an array surface mounted device.

Figure 3:
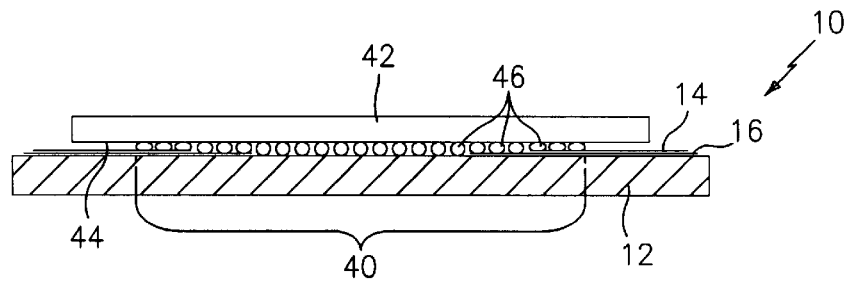
FIG. 3 is a side partially schematic view of a substrate structure and mounted device in accordance with the invention.

Referring back to FIG. 2, the multi-layer and cutout structure of the present invention defines a stair step cavity which has a portion of pads 18 defining mounting site 40 on each horizontal step surface. Although layers 14 and 16 are shown having exaggerated thickness in FIG. 2 for clarity, FIG. 3 illustrates substrate structure 10 having less exaggerated thickness and a typical array surface mounted device 42 mounted thereon. As shown, device 42 has a mounting surface 44 which is provided with a plurality or array of contact elements or solder balls 46. During assembly, device 42 of FIG. 3 is positioned over site 40 with balls 46 contacting pads 18 (FIG. 4), and heat and/or solder paste may be provided so as to form a good connection between balls 46 and pads 18 as desired. The stair step cavity of the multi-layer substrate 10 of the present invention advantageously serves to provide for excellent contact with each ball 46 of device 42 by virtue of the fact that each layer 12, 14 is provided having a total thickness which is sufficiently small that the total spacing or distance between contact surface 24 of base layer 12, and pads 18 disposed thereon, and contact surface 26 of outer layer 14, and pads 18 disposed thereon, is less than or equal to about 3 mils. This restriction on spacing allows for reliable contact between balls 46 of device 42 and pads 18 of substrate structure 10 despite the different heights or depths of pads 18 positioned in arrays 20, 30 and 36. This advantageously provides for etching or positioning of traces directly upon the layer 12, 14, 16 which bears the respective connected pad 18, thereby completely avoiding the need for vias positioned directly beneath mounting site 40. This structure further serves to help reduce the total layer count needed for a particular substrate structure.

Figure 4:
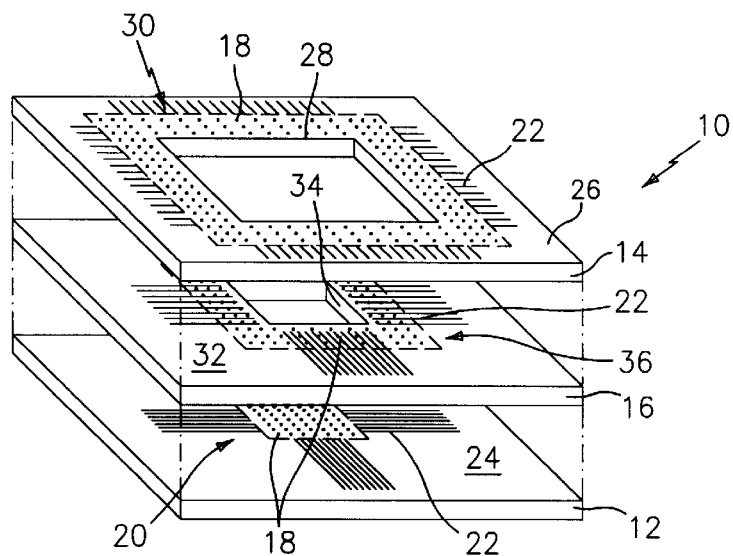
FIG. 4 is an exploded perspective view of a substrate structure in accordance with the present invention showing pads at various stair step levels for contacts with balls of a BGA package or device.

FIG. 4 further illustrates substrate structure 10 in accordance with the present invention, and shows base layer 12, an intermediate layer 16 and outer layer 14 in an exploded view to illustrate contact surfaces 24, 26 and 32 of each layer, as well as traces 22 connected to pads 18 thereon.

Figure 5:
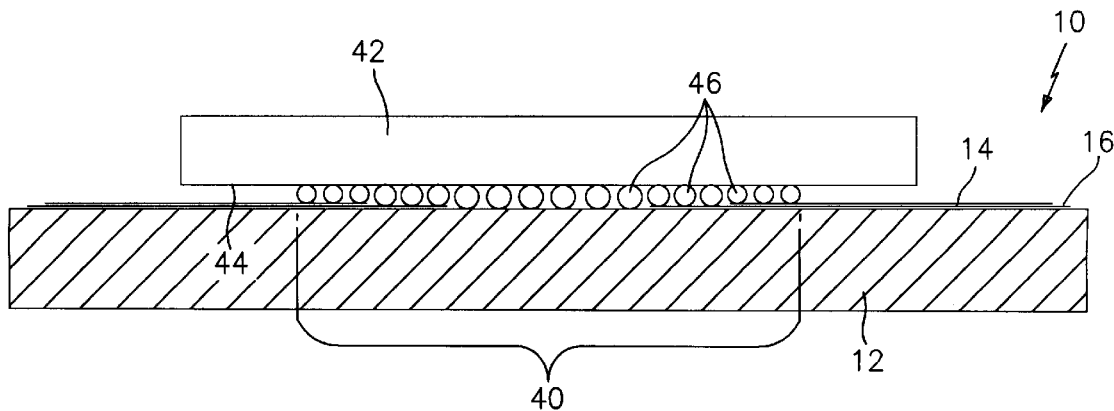
FIG. 5 is a side partially schematic view of an alternate embodiment of a substrate structure and mounted device in accordance with the present invention.

Referring now to FIG. 5, in accordance with an alternative embodiment of the present invention, device 42 may suitably be provided having balls 46 of different sizes so as to accommodate the slight difference in height of layers 12, 14 and 16. This feature is shown in exaggerated size so as to more clearly illustrate the features of the present invention. In accordance with this aspect of the present invention, balls 46 corresponding to first array 20 may be larger in size than balls 46 corresponding to array 36, which would in turn be larger in size than balls 46 corresponding to array 30. For example, the outermost three rows of balls 46 could be provided having a size of about 22 mils, while the next three peripheral rows of balls 46, corresponding to array 36, could be provided having a size of about 23 mils, and the innermost group of balls 46 corresponding to first array 20 could be provided having a size of about 25 mils. This sizing of balls 46 would correspond acceptably with a configuration of substrate structure 10 as described wherein top or outer layer 14 and intermediate layer 16 each have a thickness of less than or equal to about 1 mil.

It should be noted that layers 12, 14 and 16 in accordance with the present invention are suitably laminated together in substantially adjacent relationship, with each layer progressively spaced further from base layer 12 having a larger cutout to expose underlying arrays of other layers. These layers may be laminated together using conventional techniques which would be readily known to one of ordinary skill in the art. Furthermore, layers 12, 14 and 16 are preferably provided of a suitable dielectric material, also as is well known to one of ordinary skill in the art. It should also be noted that bottom or base layer 12 may suitably be any conventional PCB board, as the thickness of this layer does not impact upon the depth of the cavity defined by layers 14, 16. Thus, for example, base layer 12 could suitably be a conventional 62 mil PCB such as FR-4 or the like.

It should also be noted that although this disclosure is made in terms of a substrate structure 10 having two layers 14, 16 mounted above base layer 12, it would of course be possible, and well within the scope of the present invention, to provide a single top or outer layer mounted to base or core layer 12, or to provide additional layers mounted to base layer 12, provided that the thickness of each layer is sufficiently small that the transverse distance or vertical distance between pads 18 on base layer 12 and pads 18 on outer layer 14 is sufficiently small that contact with balls 46 of device 42 can readily be accomplished. In this regard, it should also be noted that many conventional devices or components 42 tend to warp upwards at the corners thereof, and the structure in accordance with the present invention has the inherent tendency to compensate for this warping, which is also advantageous.

It should readily be apparent that substrate structure 10 in accordance with the present invention advantageously provides a mounting site 40 for a wide variety of different devices or components, such as multi-chip modules, BGAs, CSPs, flip chips and the like. Furthermore, substrate structure 10 in accordance with the present invention could readily be used for mounting chips within packages as well as for mounting packages to substrates, and would provide similar advantages in this environment. Array surface mounted devices such as those discussed above and chips themselves to be mounted within packages are referred to collectively herein as surface mount devices.

It should also readily be appreciated that although certain components of substrate structure 10 of the present invention are referred to with respect to vertical orientation, such as bottom layer 12, top layer 14 and upper surfaces 24, 26 and 32, substrate structure 10 in accordance with the present invention could of course be provided in an inverted orientation. In this orientation, the stair step cavity defined by cutouts 28, 34 faces downward, and base layer 12 has layers 16, 14 positioned on its bottom or secondary surface. Of course, in this configuration, traces 22 and pads 18 would be positioned on contact surfaces 24, 26 and 32 facing downwardly. Thus, nothing in this disclosure should be construed as limiting the scope of the invention to any particular orientation of substrate structure 10. Further, as set forth above, substrate structure 10 may suitably be provided on primary or secondary sides of a base layer or PCB, or both, all well within the scope of the present invention.

Finally, it should also be readily apparent that the substrate structure 10 in accordance with the present invention advantageously provides for elimination or at least substantial reduction in the number of vias which must be positioned below device 42 on mounting site 40. This significantly reduces the cost of substrate structure 10, and further completely eliminates an entire source of reliability problems. Furthermore, substrate structure 10 in accordance with the present invention serves to reduce the total number of layers which are required, thereby also providing for a reduction in cost. Alternatively, the structure of the present invention could be used in connection with several dielectric layers to allow the use of wider traces between pads, which in some applications could also provide for a reduction in cost.

It is to be understood that the invention is not limited to the illustrations described and shown herein, which are deemed to be merely illustrative of the best modes of carrying out the invention, and which are susceptible of modification of form, size, arrangement of parts and details of operation. The invention rather is intended to encompass all such modifications which are within its spirit and scope as defined by the claims.

We claim:

1. A substrate structure for surface mount devices, comprising:

a plurality of substrate layers including at least a base layer and an outer layer;

said base layer having a contact surface and a first array of conductive pads on said contact surface;

said outer layer having a contact surface, a cutout and a second array of conductive pads on said contact surface; and said outer layer being mounted to said base layer with said cutout positioned over said first array of conductive pads, wherein said first array and said second array of conductive pads define in combination a device mounting site wherein said second array of conductive pads is disposed in an array positioned along at least a portion of said contact surface, and wherein said array is equal to 3 pads in width whereby traces for each pad of said second array can be positioned on said contact surface of said outer layer.

2. A substrate structure according to claim 1, further comprising at least one intermediate layer disposed between said base layer and said outer layer and having a contact surface, a cutout, and a third array of conductive pads, said cutout of said intermediate layer being positioned over said first array of conductive pads and said cutout of said outer layer being positioned over said first array of conductive pads and said third array of conductive pads whereby said first, second and third arrays define in combination said device mounting site.

3. A substrate structure according to claim 1, wherein said first array and said second array of conductive pads are spaced a distance, in a perpendicular direction with respect to said layers, of less than or equal to about 3 mils.

4. A substrate structure according to claim 1, further comprising a first plurality of traces connected to said first array of conductive pads and extending along said contact surface of said base layer, and a second plurality of traces connected to said second array of conductive pads and extending along said contact surface of said outer layer.

5. A substrate structure according to claim 1, further comprising at least one intermediate layer between said outer layer and said base layer, and wherein said outer layer and said at least one intermediate layer in combination have a thickness of less than or equal to about 3 mils.

6. A substrate structure according to claim 2, wherein each of said at least one intermediate layer and said outer layer has a thickness of less than or equal to about 1 mil.

7. A substrate structure according to claim 1, wherein said plurality of substrate layers are layers of dielectric material.

8. A substrate structure according to claim 2, wherein said outer layer and said at least one intermediate layer are layers of dielectric material.

9. A substrate structure for surface mount devices, comprising:

a plurality of substrate layers including at least a base layer and an outer layer;

said base layer having a contact surface and a first array of conductive pads on said contact surface;

said outer layer having a contact surface, a cutout and a second array of conductive pads on said contact surface; and said outer layer being mounted to said base layer with said cutout positioned over said first array of conductive pads, wherein said first array and said second array of conductive pads define in combination a device mounting site wherein said first array and second array of conductive pads are spaced a distance in a perpendicular direction with respect to said layers of less than or equal to about 3 mils.

10. A substrate structure for surface mount devices, comprising:

a base layer having a contact surface and a first array of conductive pads on said contact surface; and at least one additional layer each having a contact surface, a cutout and a further array of conductive pads around said cutout on said contact surface, said at least one additional layer being positioned substantially adjacent to said base layer such that said first array of conductive pads and said further array of conductive pads of each additional layer define in combination a device mounting site for receiving a single surface mount device, said mounting site including said first array of conductive pads and said further array of conductive pads, wherein said at least one additional layer includes an outer layer having a contact surface and an outer array of conductive pads on said contact surface, and wherein said first array and said outer array of conductive pads are spaced a distance in a perpendicular direction with respect to said base layer and said at least one additional layer of less than or equal to about 3 mils.

11. A substrate structure according to claim 10, wherein said at least one additional layer comprises a plurality of layers stacked adjacent to said base layer, and wherein said cutout of each additional layer positioned sequentially away from said base layer is at least as large as said further array of a preceding layer of said plurality of layers.

12. A substrate structure according to claim 10, further comprising a first plurality of conductive traces connected to said first array of conductive pads and disposed along said contact surface of said base layer, and a second plurality of conductive traces connected to said further array of conductive pads and disposed along said contact surface of each layer of said at least one additional layer.

13. A printed circuit structure, comprising:

a surface mount device having a mounting surface and a plurality of conductive members disposed on said mounting surface; and a substrate structure for mounting said device, comprising a plurality of substrate layers including at least a base layer and an outer layer; said base layer having a contact surface and a first array of conductive pads on said contact surface; said outer layer having a contact surface, a cutout and a second array of conductive pads on said contact surface; and said outer layer being mounted to said base layer with said cutout positioned over said first array, said first array and said second array defining in combination a device mounting site;

said surface mount device being connected to said mounting site with said conductive members connected to said first array and said second array.

14. A printed circuit structure according to claim 13, wherein said device is mounted to said substrate overlapping at least a portion of said base layer and said top layer.

15. A printed circuit structure according to claim 13, wherein said conductive members are substantially identical in size.

16. A printed circuit structure according to claim 13, wherein said conductive members include a first group of members arranged to contact said first array, and a second group of members arranged to contact said second array, and wherein members of said first group are larger in size than members of said second group.

* * * * *